(12) United States Patent
Millward

(10) Patent No.: US 8,084,345 B2
(45) Date of Patent: Dec. 27, 2011

(54) METHODS OF FORMING DISPERSIONS OF NANOPARTICLES, AND METHODS OF FORMING FLASH MEMORY CELLS

(75) Inventor: Dan Millward, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/871,838

(22) Filed: Aug. 30, 2010

(65) Prior Publication Data

US 2010/0323510 A1  Dec. 23, 2010

Related U.S. Application Data

(63) Continuation of application No. 12/034,921, filed on Feb. 21, 2008, now Pat. No. 7,785,998.

(51) Int. Cl.
*H01L 21/3205* (2006.01)
*H01L 21/4763* (2006.01)

(52) U.S. Cl. . 438/591; 438/564; 438/762; 257/E21.567; 977/700; 977/740; 977/748

(58) Field of Classification Search ............... 438/564, 438/591, 762; 257/40, E21.567; 423/263, 423/579, 594; 428/546, 548, 220; 977/700, 977/740, 748

See application file for complete search history.

(56) References Cited

U.S. PATENT DOCUMENTS

| 5,782,986 | A | 7/1998 | Butterbaugh et al. |
| 5,962,285 | A | 10/1999 | Anderson et al. |
| 6,649,138 | B2 | 11/2003 | Adams et al. |

(Continued)

FOREIGN PATENT DOCUMENTS

WO  WO2006025627 A1  3/2006

(Continued)

OTHER PUBLICATIONS

Els Parton et al. "Biomedical Applications Using Magnetic Nanoparticles" 2007, Solid State Technology, pp. 1-8.

(Continued)

*Primary Examiner* — Charles Garber
*Assistant Examiner* — Abdulfattah Mustapha
(74) *Attorney, Agent, or Firm* — Wells St. John, P.S.

(57) ABSTRACT

Some embodiments include methods of forming dispersions of nanoparticles. The nanoparticles are incorporated into first coordination complexes in which the nanoparticles are coordinated to hydrophobic ligands, and the first coordination complexes are dispersed within a non-polar solvent. While the first coordination complexes are within the non-polar solvent, the ligands are reacted with one or more reactants to convert the first coordination complexes into second coordination complexes that contain hydrophilic ligands. The second coordination complexes are then extracted from the non-polar solvent into water, to form a mixture of the second coordination complexes and the water. In some embodiments, the mixture may be dispersed across a semiconductor substrate to form a uniform distribution of the nanoparticles across the substrate. In some embodiments, the nanoparticles may then be incorporated into flash memory devices as charge-trapping centers.

22 Claims, 9 Drawing Sheets

U.S. PATENT DOCUMENTS

| | | |
|---|---|---|
| 6,913,825 B2 | 7/2005 | Ostafin et al. |
| 7,122,168 B2 | 10/2006 | Woo et al. |
| 7,186,398 B2 | 3/2007 | Andres et al. |
| 2004/0033345 A1 | 2/2004 | Dubertret et al. |
| 2004/0247924 A1 | 12/2004 | Andres et al. |
| 2006/0228554 A1 | 10/2006 | Tan et al. |
| 2007/0054502 A1* | 3/2007 | Seol et al. ............ 438/782 |
| 2007/0126001 A1* | 6/2007 | Choi et al. ............ 257/40 |
| 2007/0140951 A1 | 6/2007 | O'Brien et al. |
| 2008/0241041 A1 | 10/2008 | Clothier et al. |

FOREIGN PATENT DOCUMENTS

| | | |
|---|---|---|
| WO | WO2006080895 A1 | 8/2006 |

OTHER PUBLICATIONS

Jongnam Park et al., "Synthesis of Monodisperse Spherical Nanocrystals," Angewandte Chemie Angew. Chem. Int. Ed. 2007, 46, pp. 4630-4660.

Xun Wang et al., "A General Strategy for Nanocrystal Synthesis," Nature Publishing Group, vol. 437/1, Sep. 2005, pp. 121-124.

Yadong Yin et al., "Colloidal Nanocrystal Synthesis and the Organic-Inorganic Interface," Insight Review Nature, vol. 437/29, Sep. 2005.

Tierui Zhang et al. "A General Approach for Transferring Hydrophobic Nanocrystals into Water," American Chemical Society, 2007, pp. A-E.

* cited by examiner

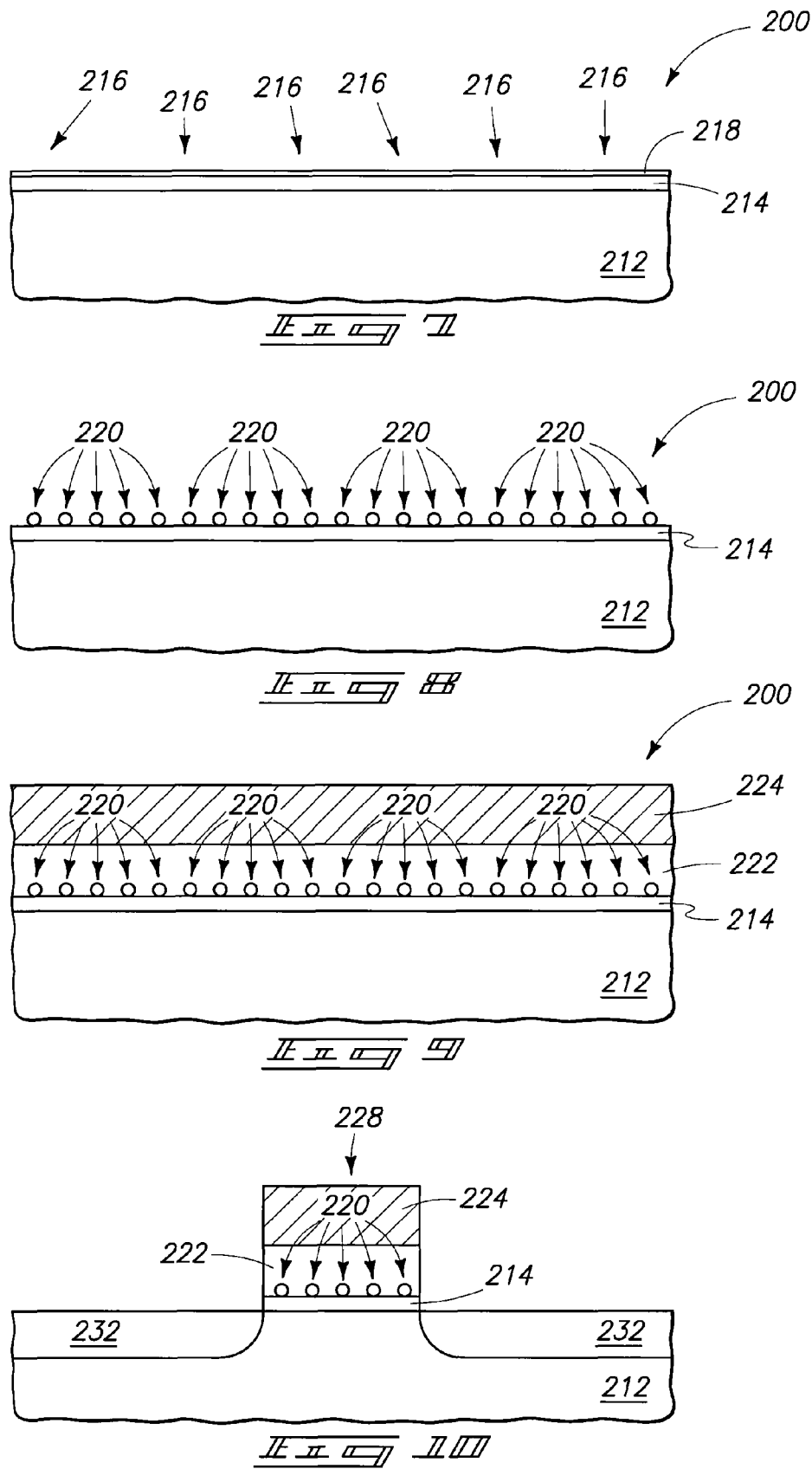

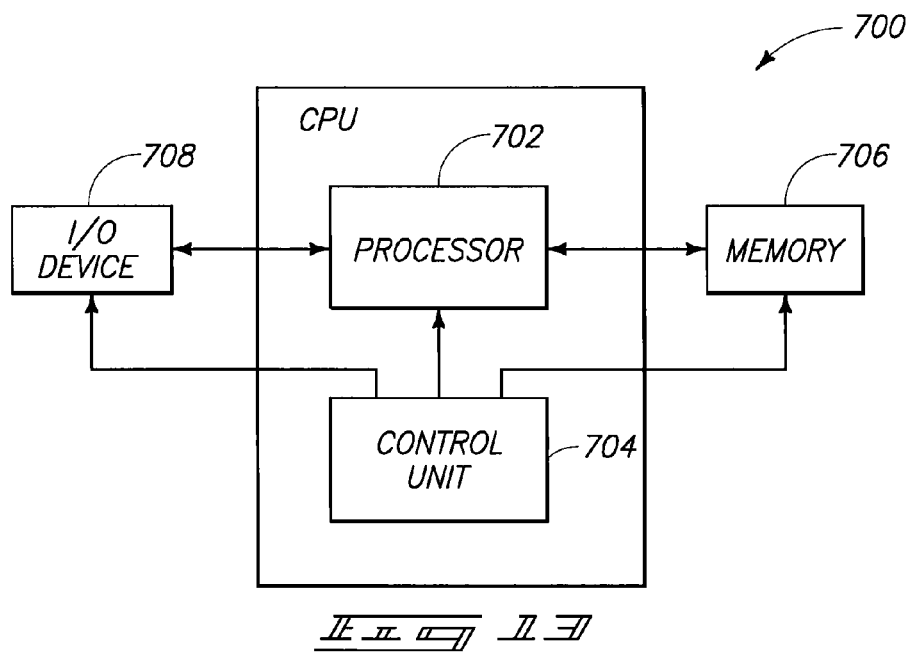
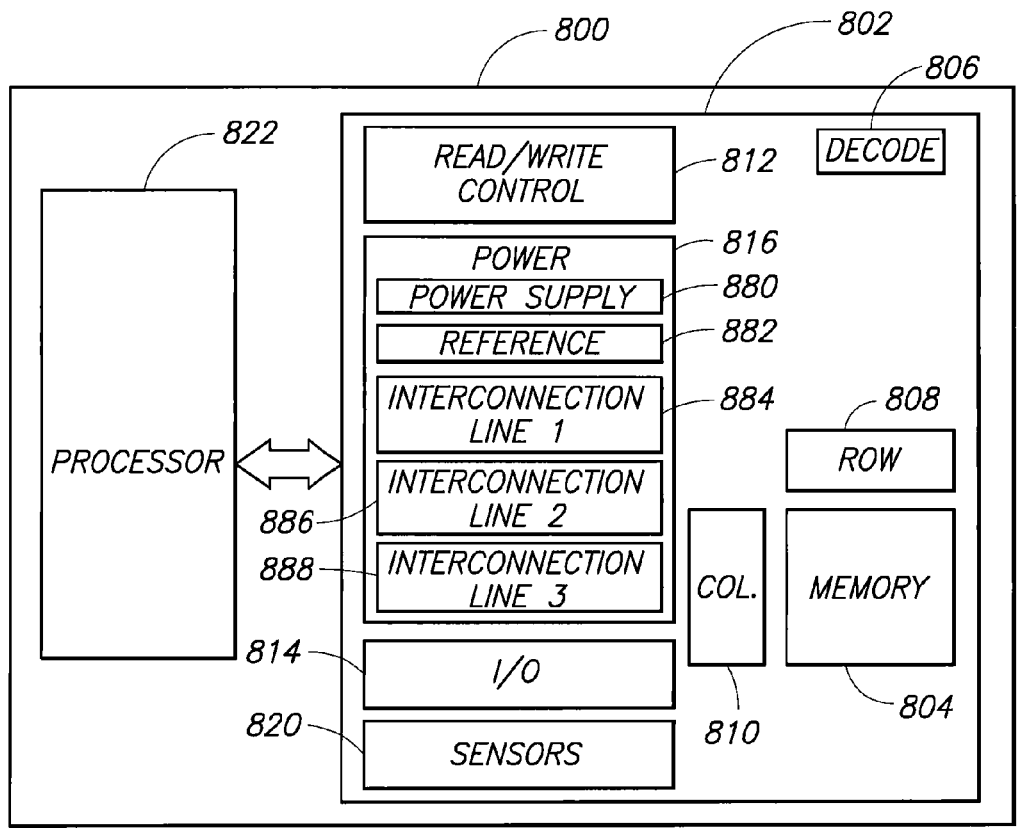

METHODS OF FORMING DISPERSIONS OF NANOPARTICLES, AND METHODS OF FORMING FLASH MEMORY CELLS

RELATED PATENT DATA

This application is a continuation of U.S. patent application Ser. No. 12/034,921, which was filed on Feb. 21, 2008 and which is incorporated herein by reference.

TECHNICAL FIELD

Methods of forming dispersions of nanoparticles, and methods of forming flash memory cells.

BACKGROUND

Methods have been developed for preparation of uniformly-sized dispersed colloidal metal and metal-oxide nanoparticles via high-temperature thermolysis of organometallic species in non-polar, organic solvents. The particles are coordinated with organic ligands, and thus are within nanoparticle-containing complexes. The organic ligands may form a shield around the individual nanoparticles to prevent agglomeration of the nanoparticles with one another.

Uniformly-sized dispersed nanoparticles are particularly well-suited for many applications. Among the applications are utilization in semiconductor devices, and/or utilization as abrasive material for semiconductor device fabrication. For instance, nanoparticles may be utilized as charge-trapping centers of flash memory devices, and/or may be incorporated into slurries utilized for chemical-mechanical polishing (CMP) of surfaces during semiconductor device fabrication.

The nanoparticles are better suited for many applications if the nanoparticles are dispersed in water rather than being dispersed in organic liquid. For instance, water may be more compatible for utilization in semiconductor processing than organic liquids. Accordingly, it is desired to transfer the nanoparticles from organic liquid to water prior to utilization of the nanoparticles in some applications. Problems may occur during such transfer if the nanoparticles agglomerate rather than remaining well-dispersed. Additionally, problems may occur if the transfer comprises high-temperature treatment of the nanoparticles.

Some methods have been developed for transferring the nanoparticles from organic liquid to water by exchanging hydrophobic ligands of the nanoparticle-containing complexes with hydrophilic ligands. However, such exchange may lead to particle agglomeration and/or may utilize high-temperature processing and multiple solvents. Accordingly, it is desired to develop new methods for transferring nanoparticles from organic solvent to water.

BRIEF DESCRIPTION OF THE DRAWINGS

FIG. 7-10 are diagrammatic, cross-sectional views of a portion of a semiconductor wafer at various process stages of an embodiment.
FIG. 13 is a high level block diagram of an electronic system embodiment.
FIG. 14 is a simplified block diagram of a memory device embodiment.

DETAILED DESCRIPTION OF THE ILLUSTRATED EMBODIMENTS

Figure 1:
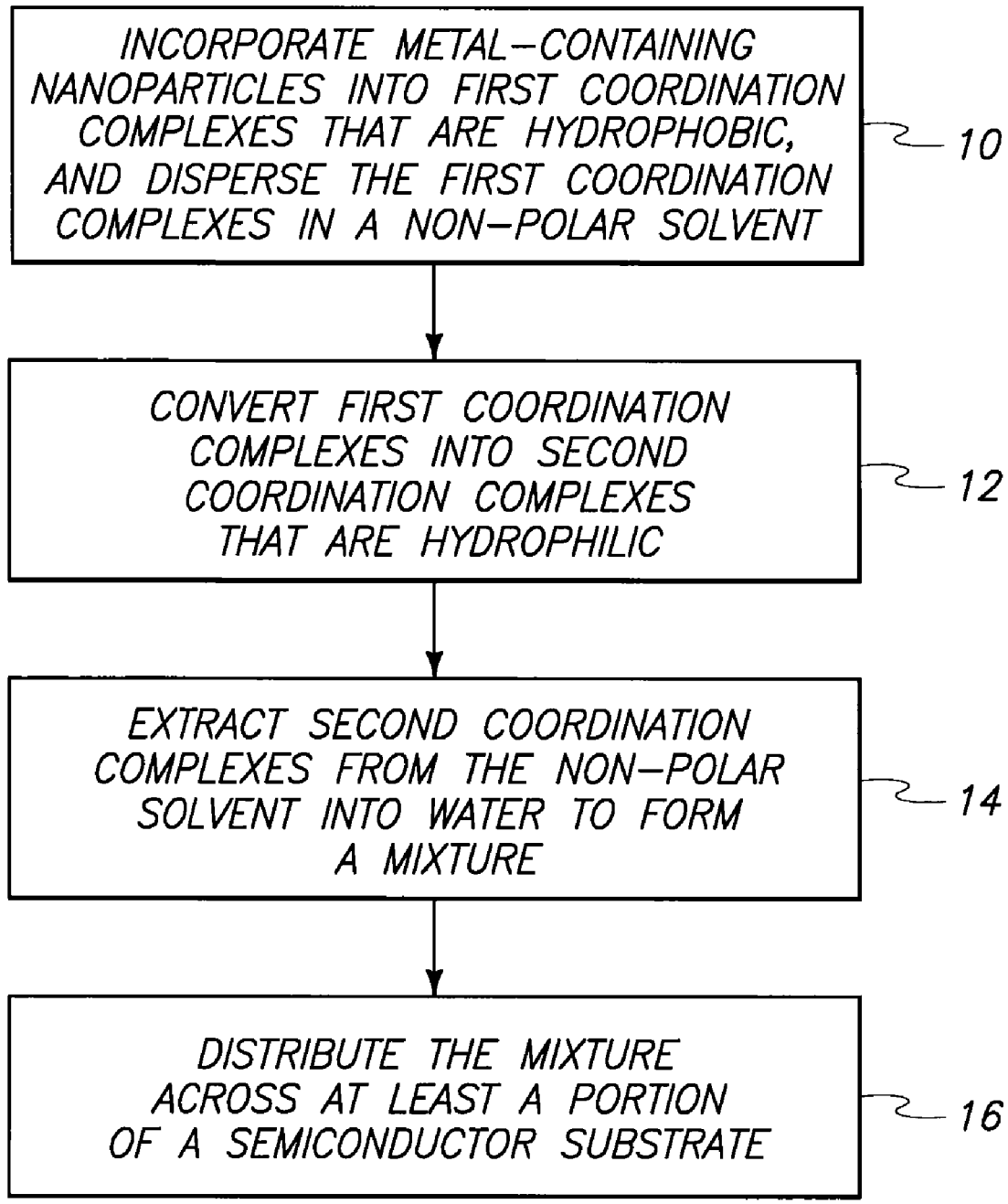
FIG. 1 is a flow chart diagram of an embodiment.

For purposes of interpreting this document and the claims that follow, "nanoparticles" are particles having a maximal cross-sectional dimension of less than 100 nanometers. The nanoparticles are "particles" in the sense that they are clusters of chemical components, rather than being single atoms or molecules. The nanoparticles may be mixtures (for instance, alloys), or aggregates (multiple discrete particles that are clumped together); and in some embodiments may be crystalline (either polycrystalline or monocrystalline).

If the nanoparticles are crystalline, they may comprise an aggregate of two or more different crystalline parts in some embodiments. If the nanoparticles are crystalline (either single grain or polycrystalline), the nanoparticles may comprise at least 8 atoms arranged in one or more crystalline unit cells, (for instance, a cubic unit cell). In some embodiments, the nanoparticles may be metallic and crystalline, and may, for example, comprise one or more of Pt, Ru and Rh.

If the nanoparticles are utilized as charge-trapping centers, the nanoparticles may comprise multi-atom clusters containing less than 120 atoms; and may be, for example, multi-atom, or multi-molecular, clusters containing from 20 atoms to 120 atoms.

The nanoparticles may be initially prepared in non-polar solvent to form complexes of the nanoparticles with hydrophobic ligands. The hydrophobic ligands have transformable reactive moieties. Such complexes are exposed to reaction conditions which transform the reactive moieties into water-soluble groups, and accordingly transform the complexes into hydrophilic complexes. The hydrophilic complexes may be ambiphilic, and thus be soluble in both aqueous and non-polar solvents. The ambiphilic complexes may be considered hydrophilic if they have increased solubility in aqueous solvent than in non-polar solvent. For instance, poly(ethylene oxide) and protonated carboxylic acid may have solubility in both aqueous and non-polar solvents, and may have increased solubility in the aqueous solvent than in the non-polar solvent.

After the complexes are transformed into hydrophilic complexes, or during the transformation to the hydrophilic complexes, water is mixed with the non-polar (i.e., organic) solvent having the hydrophilic complexes therein. The water and organic solvent may separate from one another to form a two-phase solution. The hydrophilic complexes migrate from the non-polar solvent phase to the aqueous phase, and are thereby extracted into the water. The aqueous phase having the hydrophilic complexes therein may be considered a mixture, and such mixture may be separated from the non-polar phase. The mixture having the hydrophilic complexes dispersed within water may be utilized to uniformly distribute the nanoparticles across a surface (for instance, a surface of a semiconductor substrate). In other embodiments, the mixture having the hydrophilic complexes dispersed within water may be utilized as a mild abrasive, and may, for example, be utilized as an abrasive for CMP.

An example embodiment is described with reference to a flow chart in FIG. 1.

A first step 10 comprises incorporation of nanoparticles into first coordination complexes that are hydrophobic, and dispersion of the first coordination complexes in a non-polar solvent. Step 10 may be accomplished with conventional methods of synthesizing nanoparticle-containing complexes, such as the thermal decomposition of organometallic species such as atomic layer deposition (ALD) precursors or chemical vapor deposition (CVD) precursors in the presence of ligand. Such decomposition may occur within a non-polar solvent, or may be followed by dispersal of the nanoparticle-containing complexes within a non-polar solvent.

A second step 12 comprises conversion of the first coordination complexes into second coordination complexes that are hydrophilic. Such step is illustrated diagrammatically in FIG. 2. Specifically, a first coordination complex 20 is shown to comprise a nanoparticle core 22 surrounded by a plurality of ligands 24. Each of the ligands comprises a head region 26 where the ligands coordinate to the core 22, and comprises a tail "$R_1$" bonded to the head region.

The core 22 is shown comprising three subunits 21, 23 and 25. Each subunit may comprise a metal and/or a semiconductor material (for instance, may comprise, consist essentially of, or consist of one or more of palladium, platinum, nickel, cobalt, ruthenium, rhodium, silicon and germanium). Each subunit may be a separate multi-atom or multi-molecule composition. In some embodiments, at least one of the subunits may be crystalline, and may be either a single crystal or polycrystalline. In example embodiments, each subunit may comprise, consist essentially of, or consist of metal-containing molecules, such as elemental metal, metal alloy, metal nitride, metal oxide, etc. In some embodiments, one or more of the subunits may be crystalline, and may, for example, comprise at least one crystal of silicon dioxide, metal-containing material, etc.

The subunits may be the same as one another or may be different from one another. Although the shown core has three subunits, in other embodiments the core may have a different number of subunits than three.

Figure 2:
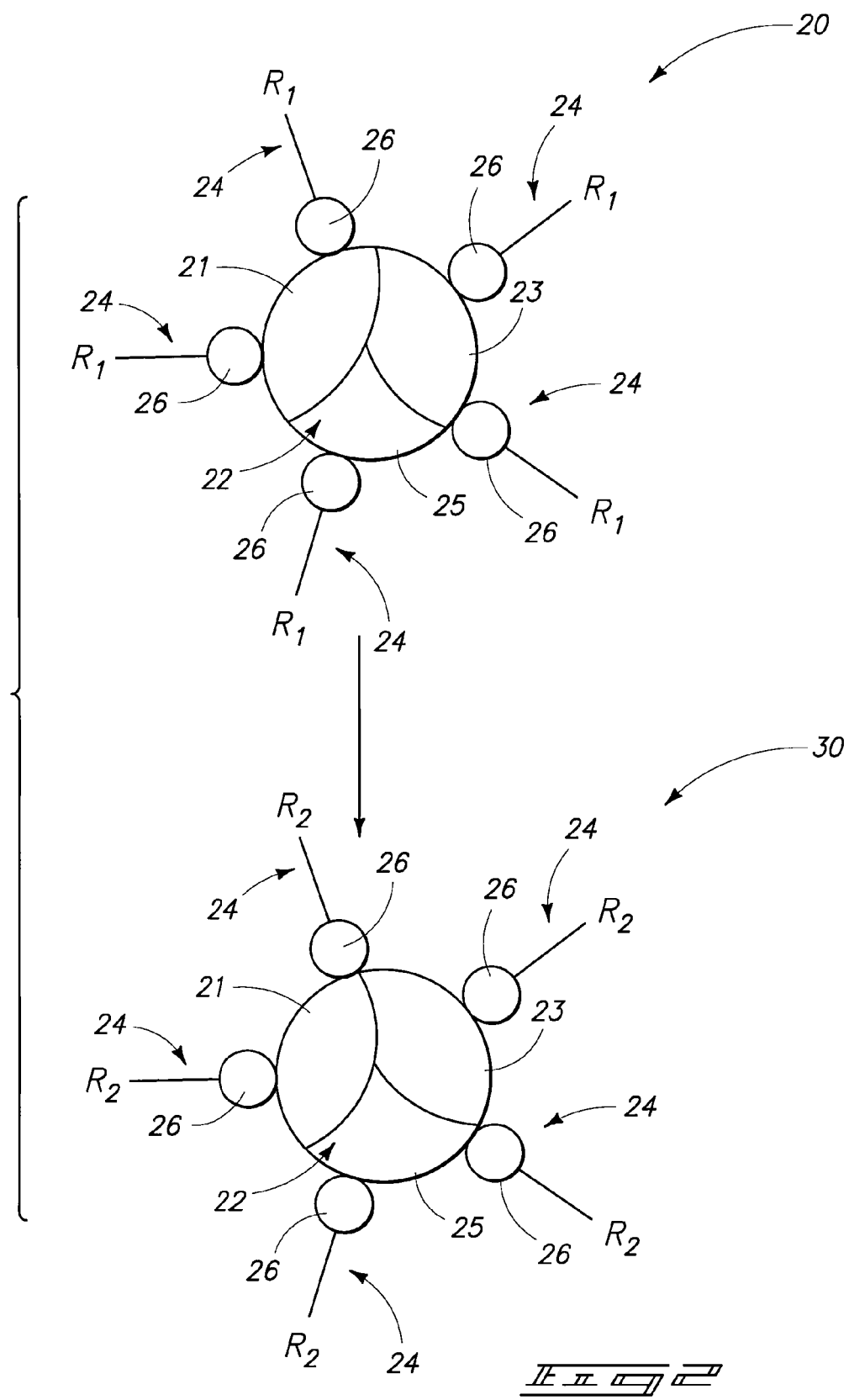
FIG. 2 is a diagrammatic illustration of a chemical reaction of an embodiment.

FIG. 2 further illustrates the first coordination complex 20 being converted to a second coordination complex 30 in which the hydrophobic groups $R_1$ are converted to hydrophilic groups $R_2$. Such conversion may comprise, for example, oxidation of the ligands $R_1$ or ester exchange, as discussed below with reference to FIGS. 3-5.

Referring again to FIG. 1, a step 14 comprises extraction of the second coordination complexes from the non-polar solvent into water to form a mixture. Such extraction may comprise mixing water with the non-polar solvent to form a two-phase system in which one of the phases is non-polar and the other is aqueous. The hydrophilic complexes will then migrate to the aqueous phase to be extracted from the non-polar solvent.

Once the aqueous mixture with the nanoparticle-containing second coordination complexes is formed, such mixture may be utilized in any of numerous applications. Step 16 of FIG. 1 describes an example application in which the mixture is distributed across at least a portion of a semiconductor substrate.

As discussed above, the conversion of ligands of a nanoparticle-containing complex from a hydrophobic form to a hydrophilic form a comprise any of numerous reactions. Example reactions are described with reference to FIGS. 3-5.

Figure 3:
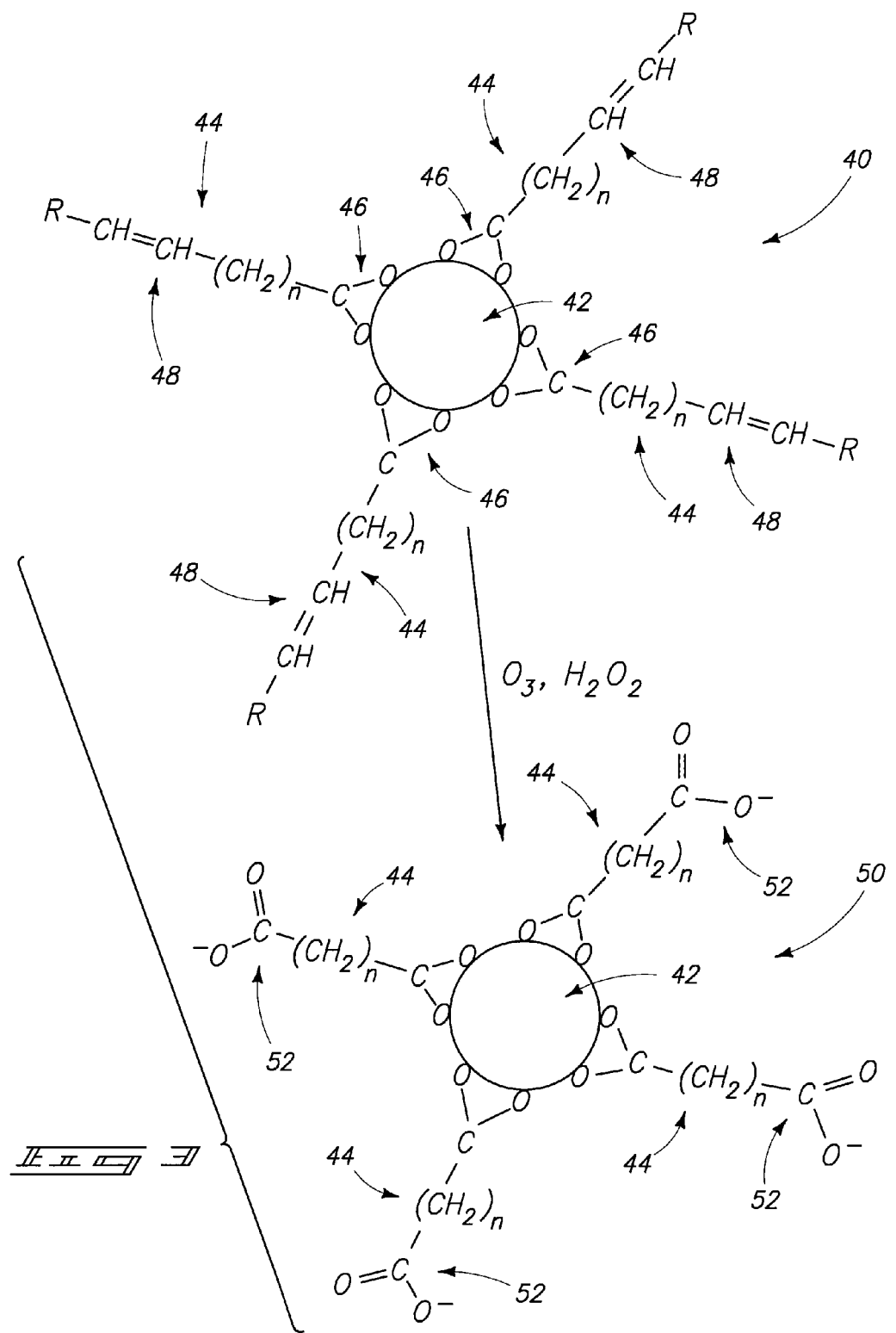
FIG. 3 is a diagrammatic illustration of a chemical reaction of an embodiment.

Referring to FIG. 3, a first complex 40 is illustrated to comprise a nanoparticle core 42 surrounded by a plurality of hydrophobic ligands 44. Core 42 may comprise any of the configurations discussed above regarding the core 22 of FIG. 2, and accordingly may comprise multiple subunits (not shown).

In the shown embodiment, all of the ligands 44 are identical to one another, but in other embodiments a mixture of different ligands may be comprised by a single coordination complex.

The illustrated ligands comprise head groups 46 corresponding to oxygen atoms of a carboxylic acid group ($—CO_2^-$), and comprise aliphatic chains 48 extending from the head groups.

The shown aliphatic chains are unsaturated, and comprise "n" methylene units extending to a carbon-carbon double bond, which in turn extends to an "R" group. The label "n" may be any integer greater than zero, and may be greater than or equal to 4 in some embodiments. Accordingly, the carbon-carbon double bond may be spaced from the oxygen head groups by a chain of at least 5 carbon atoms, or in other words, the unsaturation may occur at delta-6 or higher (utilizing the nomenclature of characterizing unsaturated fatty acids, i.e., unsaturated carboxylic acids, that the first unsaturated carbon is the delta carbon, and is numbered by counting from the carbon of the carboxylic acid). The "R" groups may correspond to hydrogen, or may correspond to chains comprising carbon and hydrogen.

FIG. 3 shows the hydrophobic first coordination complex 40 exposed to ozone ($O_3$) and hydrogen peroxide ($H_2O_2$) to convert the first coordination complex to a hydrophilic second coordination complex 50. Such conversion oxidizes the ligands 44 to break the ligands at the carbon-carbon double bond and convert the ligands into a form terminated by a carboxylic acid groups 52. The ozone-induced cleavage may be referred to ozonolysis and may be accomplished at room temperature (22° C.) or colder by bubbling ozone through the non-polar solution containing the first coordination complexes (with the first coordination complexes being shown as 40 in FIG. 3). The exposure to the hydrogen peroxide sequentially follows the exposure to the ozone.

The reaction of FIG. 3 may be considered to comprise oxidation of the carbon-carbon double bonds of the first coordination complex 40 to cleave such carbon-carbon double bonds and replace them with acid groups.

Figure 4:
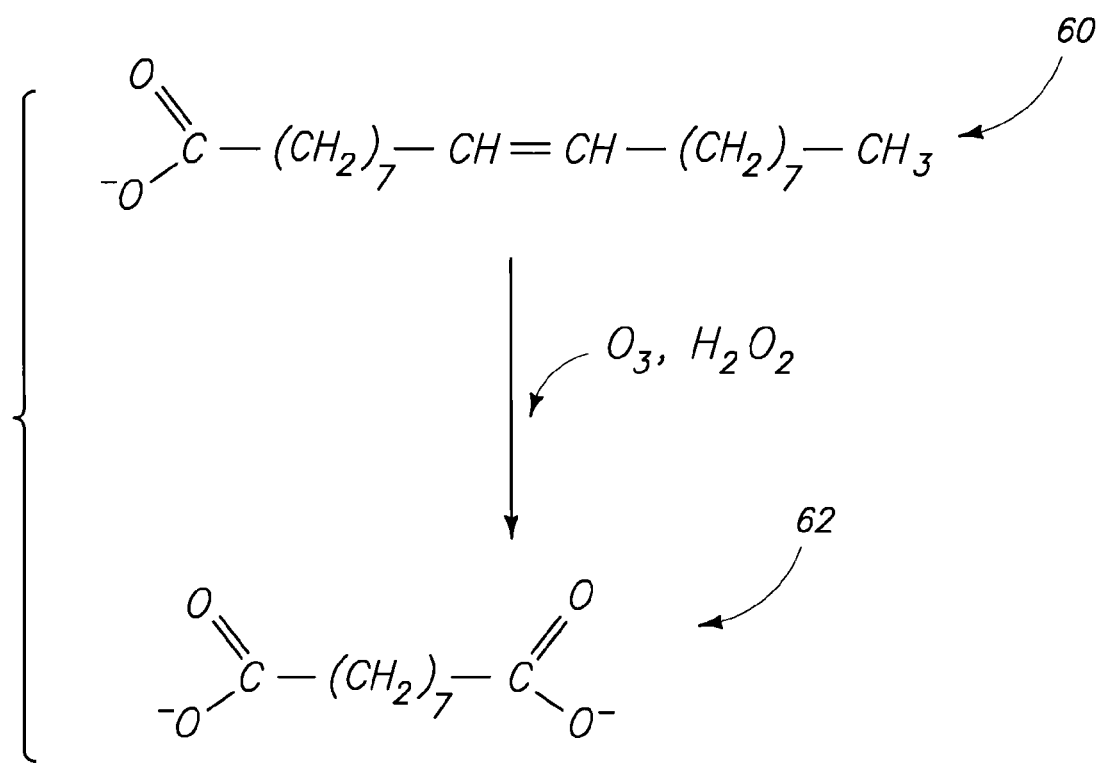
FIG. 4 is a diagrammatic illustration of a chemical reaction of an embodiment.

In an example embodiment, the ligands 44 may correspond to oleic acid, and the oxidative cleavage may convert the ligands to azelaic acid. Such is illustrated in FIG. 4, where an oleic acid ligand 60 is shown in isolation from a coordination complex. The ligand 60 may be considered a specific example of one of the ligands 44 of the coordination complex 40, with "n" equal to 7 and "R" equal to —$(CH_2)_7$—$CH_3$. The ozonolysis shown in FIG. 4 exposes ligand 60 to $O_3$, and then to $H_2O_2$, and thereby converts the ligand to an azelaic acid ligand 62. The exposure to $H_2O_2$ sequentially follows the exposure to $O_3$. The azelaic acid ligand may be considered a specific example of one of the ligands 44 of the second coordination complex 50 of FIG. 3, where "n" equals 7.

Figure 5:
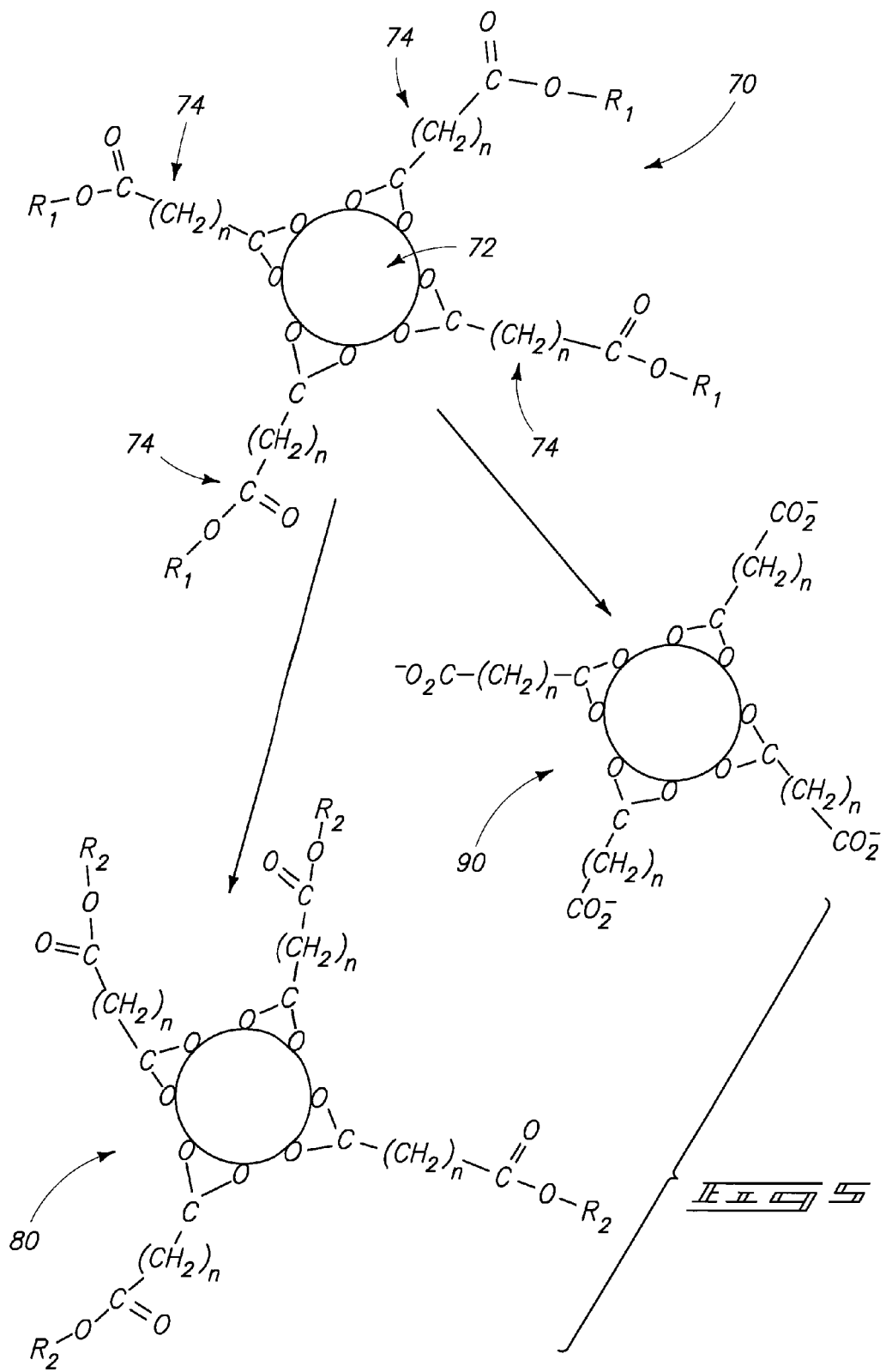
FIG. 5 is a diagrammatic illustration of a couple of chemical reactions of a pair of embodiments.

FIG. 5 shows other chemical conversions that may be utilized to convert a hydrophobic coordination complex into a hydrophilic coordination complex. Specifically, FIG. 5 shows a first coordination complex 70 containing a nanoparticle core 72 surrounded by a plurality of hydrophobic ligands 74. Core 72 may comprise multiple subunits (not shown) and may comprise any of the configurations discussed above regarding the core 22 of FIG. 2. In the shown embodiment, all of the ligands 74 are identical to one another, but in other embodiments a mixture of different ligands may be comprised by a single coordination complex.

The illustrated ligands comprise head groups corresponding to oxygen atoms of a carboxylic acid group ($-CO_2^-$), and comprise carbon-containing chains extending from the head groups. The shown carbon-containing chains include an ester, and comprise "n" methylene units extending from the carboxylic acid to the ester. The ester is bonded to a group $R_1$. The label "n" may be any integer greater than zero, and may be greater than or equal to 4 in some embodiments. Accordingly, the ester carbon may be spaced from the oxygen head groups by a chain of at least 5 carbon atoms. The "$R_1$" groups correspond to chains comprising carbon and hydrogen.

The first coordination complex may be subjected to one of two alternate chemical routes to convert the first coordination complex to either a hydrophilic second coordination complex having the form of complex 80, or to a hydrophilic second coordination complex having the form of complex 90.

The conversion to complex 80 comprises cleavage of the ester and exchange of groups $R_1$ for groups $R_2$. The groups $R_2$ may comprise any hydrophilic substituent, such as a polyol (for instance, polyethylene glycol).

The conversion to complex 90 comprises cleavage of the ester to convert the ester to a carboxylic acid. The conversion to the acid may comprise, for example, a thermal elimination utilizing beta hydroxide elimination of a t-butyl ester. As another example, the conversion to the acid may comprise aqueous cleavage with an hydroxide anion using biphasic conditions with a phase-transfer agent. If the biphasic conditions are utilized, then steps 12 and 14 of FIG. 1 may occur simultaneously.

Although the head groups of the examples of FIGS. 3-5 are carboxylate oxygens, in other embodiments the head groups may correspond to other coordinating moieties, and may, for example, correspond to coordinating moieties comprised by amines, phosphines, phosphine oxides, etc.).

Figure 6:
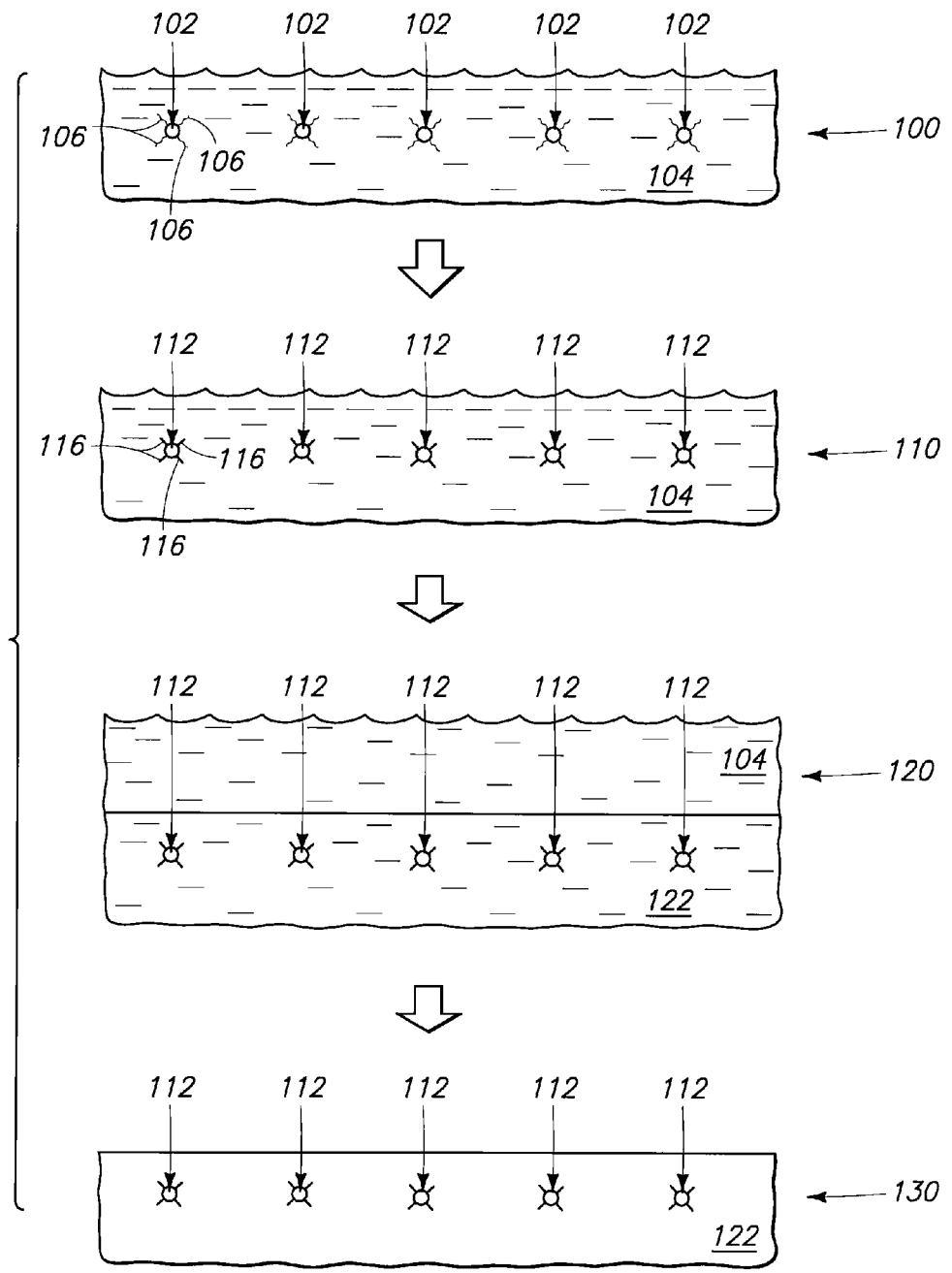
FIG. 6 is a diagrammatic, cross-sectional view of a process flow of an embodiment.

Once the hydrophobic ligands are converted to hydrophilic ligands, the coordination complexes may be extracted into a water. FIG. 6 diagrammatically illustrates a process for converting a hydrophobic first coordination complex to a hydrophilic second coordination complex, and for extracting the second coordination complex into water.

A first processing stage 100 of FIG. 6 comprises provision of a plurality of first coordination complexes 102 within a non-polar solvent 104. The first coordination complexes may comprise metallic nanoparticles coordinated to hydrophilic ligands, and accordingly may, for example, correspond to the complex 40 of FIG. 3 or the complex 70 of FIG. 5. The ligands of complexes 102 are diagrammatically illustrated in FIG. 6 as wavy lines 106 (only some of which are labeled). The non-polar solvent 104 may correspond to, for example, one or more of an aromatic substance ethereal substance and an aliphatic substance; and in some embodiments may be isooctane and/or dioctyl ether.

A second processing stage 110 of FIG. 6 comprises conversion of the hydrophobic first coordination complexes 102 into hydrophilic second coordination complexes 112. Such conversion comprises modification of the ligands of the coordination complexes while the coordination complexes remain in non-polar solvent 104. The modification of the ligands is diagrammatically illustrated by showing the second coordination complexes 112 to have ligands 116 (only some of which are labeled) which are shorter and straighter than the ligands 106 of the first coordination complexes 102. The second coordination complexes may, for example, correspond to the complex 50 of FIG. 3, or either of the complexes 80 and 90 of FIG. 5.

In the description above, the first coordination complexes 102 are referred to as being hydrophobic and the second coordination complexes 112 are referred to as being hydrophilic. The terms "hydrophobic" and "hydrophilic" are relative to one another. Thus, the reference to the coordination complexes 102 as being hydrophobic means that such coordination complexes have lower water solubility than the coordination complexes 112 that are referred to as being hydrophilic. Accordingly, the first coordination complexes 102 may be considered to have relatively low water solubility as compared to the second coordination complexes 112; and conversely, the second coordination complexes 112 may be consider to have relatively high water solubility as compared to the first coordination complexes 102.

A third processing stage 120 of FIG. 6 comprises mixing water 122 with the non-polar solvent 104, and then allowing the water and non-polar solvent to separate from one another to form a two-phase mixture. The hydrophilic second coordination complexes 112 migrate from the non-polar solvent 104 into water 122, and are thus extracted into the water.

A fourth processing stage 130 of FIG. 6 comprises separation of the water from the non-polar solvent. The remaining mixture of water with the second coordination complexes 112 may be considered to be an aqueous mixture having the nanoparticle-containing coordination complexes uniformly distributed throughout. Such mixture may be utilized for numerous applications. FIGS. 7-10 illustrate an example application in which the mixture is used to form charge-trapping centers of a flash unit cell.

Referring to FIG. 7, a portion of a semiconductor construction 200 is illustrated. The semiconductor construction comprises a base, or substrate, 212 and a gate dielectric 214 formed over the base.

Base 212 may comprise a semiconductor material, and in some embodiments may comprise, consist essentially of, or consist of monocrystalline silicon lightly doped with background p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Gate dielectric 214 may comprise any suitable composition or combination of compositions, and may, for example, comprise, consist essentially of, or consist of silicon dioxide.

A mixture 216 of nanoparticle-containing coordination complexes in water is dispersed across gate dielectric 214 to form a layer 218 over the gate dielectric. The nanoparticles may comprise semiconductor, metal, semiconductor-containing compositions or metal-containing compositions, and the nanoparticle-containing coordination complexes may be the hydrophilic complexes of the type described above as complex 50 of FIG. 3, or either of the complexes 80 and 90 of FIG. 5.

FIG. 8 shows construction 200 after the water has been volatilized from layer 218 (FIG. 7) to leave a uniform distribution of nanoparticle-containing structures 220 across the gate dielectric 214. The structures 220 may correspond to coordination complexes containing nanoparticle-containing cores surrounded by organic ligands. Alternatively, the structures may initially correspond to the coordination complexes containing the nanoparticle-containing cores surrounded by organic ligands, and then be exposed to conditions which remove the organic ligands. Example conditions are oxidative conditions which convert the organic ligands to carbon dioxide and water so that the organic ligands may be volatilized to leave only the nanoparticles within the structures 220 remaining over the gate dielectric 214.

Referring to FIG. 9, electrically insulative material 222 is formed over and between structures 220, and electrically conductive material 224 is formed over the electrically insulative material.

The electrically insulative material 222 may correspond to charge blocking material of a flash memory cell, and may comprise any suitable composition or combination of compositions. The electrically insulative material 222 may, for example, comprise, consist essentially of, or consist of silicon oxide.

The electrically conductive material 224 may correspond to control gate material of a flash memory cell, and may comprise any suitable composition or combination of compositions. The electrically conductive material 224 may, for example, comprise various metals or metal-containing compositions (for instance, one or more of titanium, tungsten, titanium nitride, tungsten nitride, etc.).

Referring to FIG. 10, the gate dielectric 214, insulative material 222, and conductive material 224 are patterned into a gate 228. Source/drain regions 230 and 232 are formed within base 212 adjacent the gate 228 by implanting one or more suitable dopants into the base.

The gate 228 in combination with the source/drain regions 230 and 232 forms a flash memory cell. The structures 220 comprising the nanoparticles form charge-trapping centers within such flash memory cell.

The flash memory cell of FIG. 10 may be utilized in any of numerous electronic systems, including, for example, computer systems, cars, cellular phones, cameras, etc.

Figure 11:
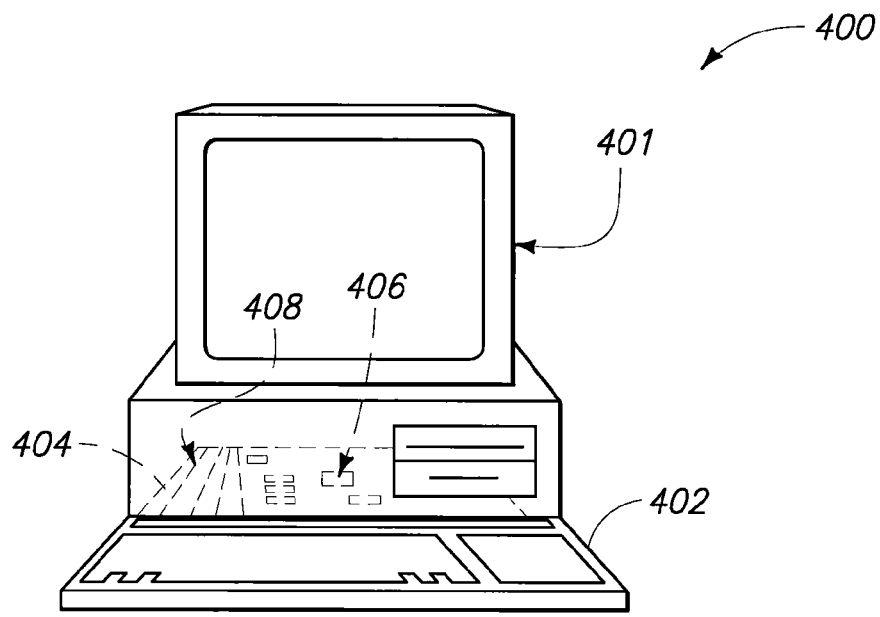
FIG. 11 is a diagrammatic view of a computer embodiment.
Figure 12:
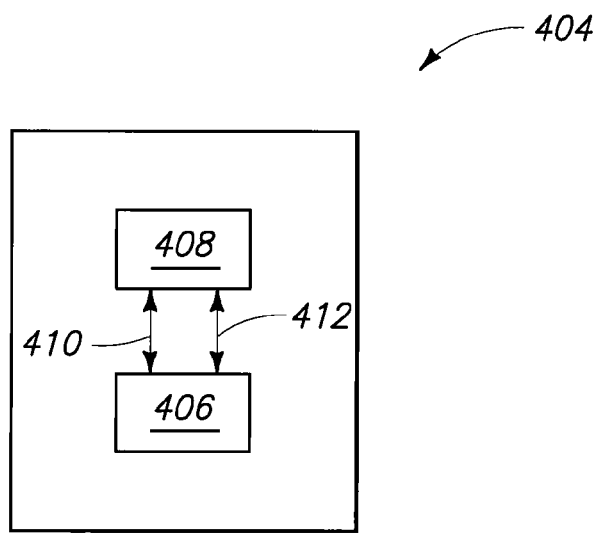
FIG. 12 is a block diagram showing particular features of the motherboard of the FIG. 11 computer embodiment.

FIG. 11 illustrates an embodiment of a computer system 400. Computer system 400 includes a monitor 401 or other communication output device, a keyboard 402 or other communication input device, and a motherboard 404. Motherboard 404 may carry a microprocessor 406 or other data processing unit, and at least one memory device 408. Memory device 408 may comprise an array of memory cells, and such array may be coupled with addressing circuitry for accessing individual memory cells in the array. Further, the memory cell array may be coupled to a read circuit for reading data from the memory cells. The addressing and read circuitry may be utilized for conveying information between memory device 408 and processor 406. Such is illustrated in the block diagram of the motherboard 404 shown in FIG. 12. In such block diagram, the addressing circuitry is illustrated as 410 and the read circuitry is illustrated as 412.

Processor device 406 may correspond to a processor module, and associated memory utilized with the module may comprise flash structures.

Memory device 408 may correspond to a memory module, and may comprise flash memory.

FIG. 13 illustrates a simplified block diagram of a high-level organization of an electronic system 700. System 700 may correspond to, for example, a computer system, a process control system, or any other system that employs a processor and associated memory. Electronic system 700 has functional elements, including a processor 702, a control unit 704, a memory device unit 706 and an input/output (I/O) device 708 (it is to be understood that the system may have a plurality of processors, control units, memory device units and/or I/O devices in various embodiments). Generally, electronic system 700 will have a native set of instructions that specify operations to be performed on data by the processor 702 and other interactions between the processor 702, the memory device unit 706 and the I/O device 708. The control unit 704 coordinates all operations of the processor 702, the memory device 706 and the I/O device 708 by continuously cycling through a set of operations that cause instructions to be fetched from the memory device 706 and executed. The memory device 706 may include flash memory, such as a flash card.

FIG. 14 is a simplified block diagram of an electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing a first wordline with pulses, circuitry 886 for providing a second wordline with pulses, and circuitry 888 for providing a bitline with pulses. The system 800 also includes a processor 822, or memory controller for memory accessing.

The memory device 802 receives control signals from the processor 822 over wiring or metallization lines. The memory device 802 is used to store data which is accessed via I/O lines. At least one of the processor 822 or memory device 802 may include flash memory.

The various electronic systems may be fabricated in single-package processing units, or even on a single semiconductor chip, in order to reduce the communication time between the processor and the memory device(s).

The electronic systems may be used in memory modules, device drivers, power modules, communication modems, processor modules, and application-specific modules, and may include multilayer, multichip modules.

The electronic systems may be any of a broad range of systems, such as clocks, televisions, cell phones, personal computers, automobiles, industrial control systems, aircraft, etc.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a dispersion of nanoparticles, comprising:
    incorporating the nanoparticles into first coordination complexes comprising the nanoparticles coordinated to ligands with relatively low water solubility; the first coordination complexes being dispersed within a nonpolar solvent;
    while the first coordination complexes are within the nonpolar solvent, and while the ligands remain coordinated with the nanoparticles, reacting the ligands with one or more reactants to increase the water solubility of the ligands without severing coordination of the nanoparticles to the ligands and thereby to convert the first coordination complexes into second coordination complexes having relatively high water solubility and including the nanoparticles coordinated to the reacted ligands;

while the second coordination complexes are within the non-polar solvent, combining the non-polar solvent with water; and extracting the second coordination complexes from the non-polar solvent into the water.

2. The method of claim 1 wherein:
the ligands comprise a head which coordinates with the nanoparticles, comprise a chain of at least five carbon atoms extending from the head, and comprise a carbon-carbon double bond joined to the head through the chain of at least five carbon atoms; and
the reacting comprises oxidation of the carbon-carbon double bonds to cleave the carbon-carbon double bonds and replace them with acid groups joined to the heads of the ligands through the chains of at least five carbon atoms.

3. The method of claim 2 wherein:
the ligands comprise oleic acid; and
the reacting converts at least some of the oleic acid to azelaic acid.

4. The method of claim 1 wherein:
the ligands comprise a head which coordinates with the nanoparticles, comprise a chain of at least five carbon atoms extending from the head, and comprise an ester joined to the head through the chain of at least five carbon atoms; and
the reacting comprises cleavage of the ester.

5. The method of claim 4 wherein the cleavage converts the ester to a carboxylic acid.

6. The method of claim 4 wherein the cleavage is accompanied by replacement of a relatively hydrophobic component of the ester with a relatively hydrophilic component.

7. The method of claim 6 wherein the relatively hydrophilic component is a polyol.

8. A method of forming a dispersion of nanoparticles, comprising:
incorporating the nanoparticles into first coordination complexes comprising the nanoparticles coordinated to unsaturated aliphatic carboxylic acids, with the unsaturation occurring at delta-6 or higher;
while the first coordination complexes are within a non-polar solvent, and while the ligands remain coordinated with the nanoparticles, oxidatively cleaving the ligands along the unsaturation to thereby convert the first coordination complexes into second coordination complexes having relatively high water solubility;
while the second coordination complexes are within the non-polar solvent, combining the non-polar solvent with water; and
extracting the second coordination complexes from the non-polar solvent into the water.

9. The method of claim 8 wherein the oxidative cleaving comprises exposing the ligands to ozone.

10. The method of claim 8 wherein:
the ligands comprise oleic acid; and
the oxidative cleaving converts the at least some of the oleic acid to azelaic acid.

11. The method of claim 1 wherein the nanoparticles comprise one or more of transition metal, silicon and germanium.

12. The method of claim 8 wherein the nanoparticles comprise one or more of transition metal, silicon and germanium.

13. A method of forming a flash memory cell, comprising:
forming first complexes that contain nanoparticles coordinated to organic ligands having relatively low water solubility;
while the first complexes are within a non-polar solvent, and while the ligands remain coordinated with the nanoparticles, converting the first coordination complexes into second coordination complexes having relatively high water solubility without severing coordination of the nanoparticles to the ligands, the second coordination complexes including the nanoparticles coordinated to converted ligands;
while the second coordination complexes are within the non-polar solvent, combining the non-polar solvent with water;
transferring the second coordination complexes from the non-polar solvent to the water to form a mixture of the second coordination complexes and water;
dispersing the mixture across a gate dielectric material supported by a semiconductor substrate;
after the mixture is dispersed across the gate dielectric, removing the water from the mixture to leave the nanoparticles as charge-trapping centers over the gate dielectric;
forming a charge-blocking material over the charge-trapping centers; and
forming a control gate over the charge-blocking material.

14. The method of claim 13 further comprising, after dispersing the mixture across the gate dielectric, oxidizing the ligands of the second coordination complexes to remove the ligands.

15. The method of claim 13 wherein the nanoparticles comprise one or more transition metals.

16. The method of claim 13 wherein the nanoparticles comprise one or more of silicon, germanium, palladium, platinum, nickel and cobalt.

17. The method of claim 13 wherein the nanoparticles consist of palladium, platinum, nickel or cobalt.

18. The method of claim 13 wherein:
the ligands comprise a head which coordinates with the nanoparticles, comprise a chain of at least five carbon atoms extending from the head, and comprise a carbon-carbon double bond joined to the head through the chain of at least five carbon atoms; and
the converting comprises oxidation of the carbon-carbon double bonds to cleave the carbon-carbon double bonds and replace them with acid groups joined to the heads of the ligands through the chains of at least five carbon atoms.

19. The method of claim 18 wherein:
the ligands comprise oleic acid; and
the converting converts at least some of the oleic acid to azelaic acid.

20. The method of claim 13 wherein:
the ligands comprise a head which coordinates with the nanoparticles, comprise a chain of at least five carbon atoms extending from the head, and comprise an ester joined to the head through the chain of at least five carbon atoms; and
the converting comprises cleavage of the ester.

21. The method of claim 20 wherein the cleavage converts the ester to a carboxylic acid.

22. The method of claim 20 wherein the cleavage is accompanied by replacement of a relatively hydrophobic component of the ester with a relatively hydrophilic component.

* * * * *